(12) United States Patent
Cheng et al.

(10) Patent No.: US 10,511,278 B2
(45) Date of Patent: Dec. 17, 2019

(54) TRANSFORMER WITH HIGH COMMON-MODE REJECTION RATIO (CMRR)

(71) Applicant: QUALCOMM Incorporated, San Diego, CA (US)

(72) Inventors: Haitao Cheng, San Diego, CA (US); Zhang Jin, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/959,824

(22) Filed: Apr. 23, 2018

(65) Prior Publication Data

US 2019/0326872 A1 Oct. 24, 2019

(51) Int. Cl.
*H03H 7/42* (2006.01)
*H01F 27/29* (2006.01)
*H01F 27/42* (2006.01)

(52) U.S. Cl.
CPC ............ *H03H 7/425* (2013.01); *H01F 27/29* (2013.01); *H01F 27/42* (2013.01)

(58) Field of Classification Search
CPC .. H03H 7/42; H03H 7/422; H01F 7/29; H01F 7/42; H01F 29/02
USPC .................................................... 333/25, 26
See application file for complete search history.

(56) References Cited

U.S. PATENT DOCUMENTS

| | | | | | |
|---|---|---|---|---|---|
| 4,301,499 | A | * | 11/1981 | Levinson | H02M 3/3378 363/101 |
| 4,422,139 | A | * | 12/1983 | Burkhead | H02M 3/335 363/131 |
| 4,816,784 | A | * | 3/1989 | Rabjohn | H01F 27/2804 333/24 R |
| 6,963,256 | B2 | * | 11/2005 | Setty | H03H 7/48 333/118 |
| 7,880,557 | B2 | * | 2/2011 | Jiang | H03D 7/1408 333/116 |
| 8,436,695 | B2 | * | 5/2013 | Mu | H03H 7/42 333/238 |

* cited by examiner

*Primary Examiner* — Dean O Takaoka
(74) *Attorney, Agent, or Firm* — Patterson & Sheridan, L.L.P.

(57) ABSTRACT

Certain aspects of the present disclosure are generally directed to a structure for a balanced-unbalanced (balun) transformer. For example, certain aspects of the present disclosure provide a transformer that generally includes a first winding having a first terminal coupled to an input node and a second terminal coupled to a reference potential node. The transformer may also include a first impedance coupled between a center tap of the first winding and the reference potential node, and a second winding magnetically coupled to the first winding and having a first terminal coupled to a first differential node of a differential output pair, a second terminal coupled to a second differential node of the differential output pair, and a center tap coupled to the reference potential node.

20 Claims, 9 Drawing Sheets

700 

702

SINK A COMMON-MODE CURRENT FROM A CENTER TAP OF A FIRST WINDING OF A TRANSFORMER TO A REFERENCE POTENTIAL NODE, THE FIRST WINDING HAVING A FIRST TERMINAL COUPLED TO AN INPUT NODE, AND A SECOND TERMINAL COUPLED TO THE REFERENCE POTENTIAL NODE

704

GENERATE A CURRENT ACROSS A SECOND WINDING OF THE TRANSFORMER CORRESPONDING TO THE COMMON-MODE CURRENT, THE SECOND WINDING BEING MAGNETICALLY COUPLED TO THE FIRST WINDING AND HAVING A FIRST TERMINAL COUPLED TO A FIRST DIFFERENTIAL NODE OF A DIFFERENTIAL OUTPUT PAIR, A SECOND TERMINAL COUPLED TO A SECOND DIFFERENTIAL NODE OF THE DIFFERENTIAL OUTPUT PAIR, AND A CENTER TAP COUPLED TO THE REFERENCE POTENTIAL NODE

TRANSFORMER WITH HIGH COMMON-MODE REJECTION RATIO (CMRR)

TECHNICAL FIELD

Certain aspects of the present disclosure generally relate to electronic circuits and, more particularly, to a transformer.

BACKGROUND

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station. The base station and/or mobile station may include one or more balanced-unbalanced (balun) transformers for converting single-ended signals to differential signals, and vice versa.

SUMMARY

Certain aspects of the present disclosure are generally directed to a structure for a balanced-unbalanced (balun) transformer (also referred to simply as a balun).

Certain aspects of the present disclosure provide a transformer. The transformer generally includes a first winding having a first terminal coupled to an input node, and a second terminal coupled to a reference potential node; a first impedance coupled between a center tap of the first winding and the reference potential node; and a second winding magnetically coupled to the first winding and having a first terminal coupled to a first differential node of a differential output pair, a second terminal coupled to a second differential node of the differential output pair, and a center tap coupled to the reference potential node.

Certain aspects of the present disclosure provide a method for signal conversion. The method generally includes sinking a common-mode current from a center tap of a first winding of a transformer to a reference potential node, the first winding having a first terminal coupled to an input node, a second terminal coupled to the reference potential node; and generating a current across a second winding of the transformer corresponding to the common-mode current, the second winding being magnetically coupled to the first winding and having a first terminal coupled to a first differential node of a differential output pair, a second terminal coupled to a second differential node of the differential output pair, and a center tap coupled to the reference potential node.

Certain aspects of the present disclosure provide a method for signal conversion. The method generally includes receiving a single-ended signal at a first terminal of a first winding of a transformer, a second terminal of the first winding being coupled to a reference potential node; selectively coupling a first impedance between a center tap of the first winding and the reference potential node; and generating a differential signal at a second winding of the transformer, a center tap of the second winding being coupled to the reference potential node.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

FIG. 7 is a flow diagram of example operations for signal conversion by sinking a common-mode current from a center tap of a transformer, in accordance with certain aspects of the present disclosure.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

An Example Wireless System

Figure 1:
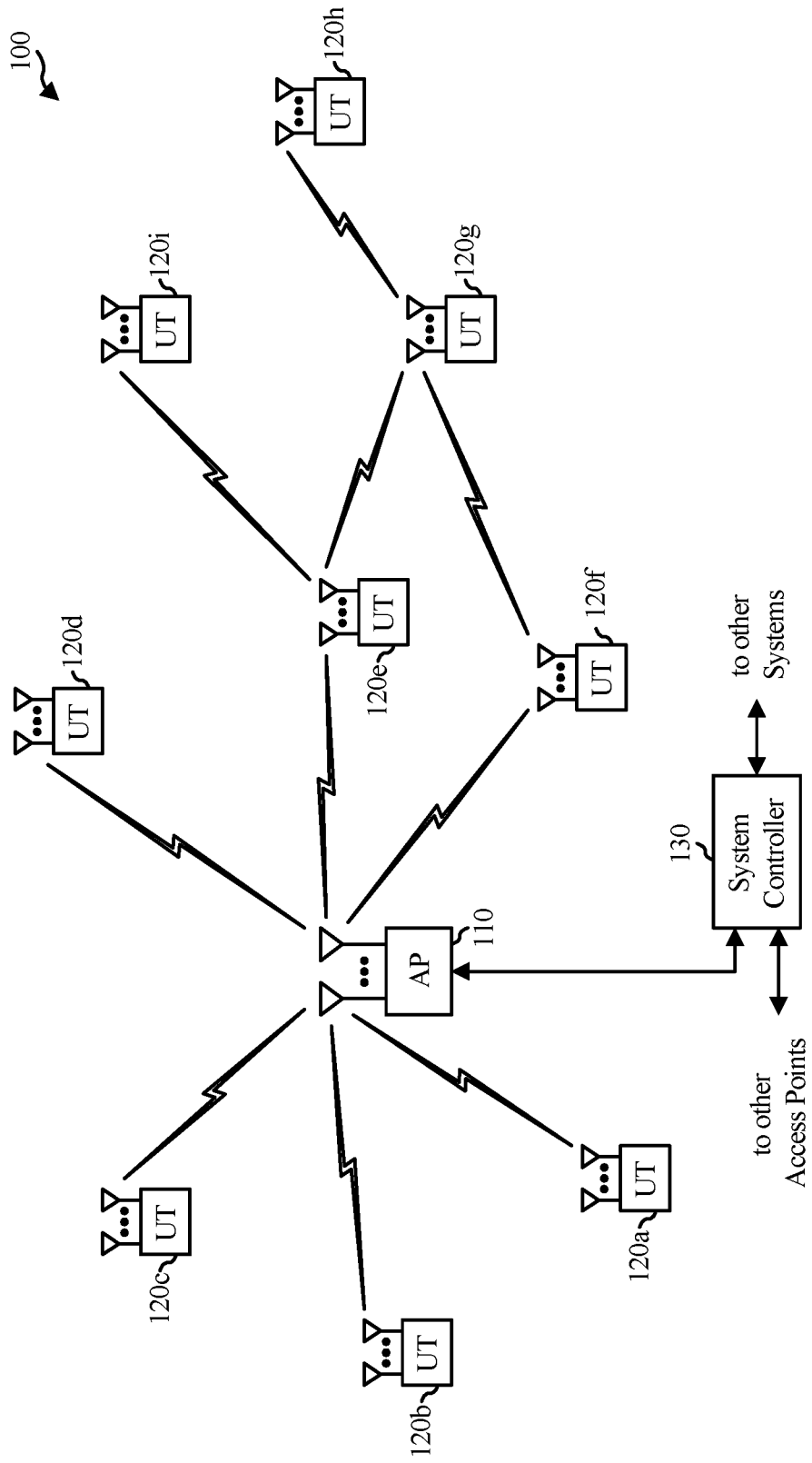
FIG. 1 is a diagram of an example wireless communications network, in accordance with certain aspects of the present disclosure.

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

System 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless system 100 may be a time division duplex (TDD) system or a frequency division duplex (FDD) system. For a TDD system, the downlink and uplink share the same frequency band. For an FDD system, the downlink and uplink use different frequency bands. System 100 may also utilize a single carrier or multiple carriers for transmission. Each user terminal 120 may be equipped with a single antenna (e.g., to keep costs down) or multiple antennas (e.g., where the additional cost can be supported). In certain aspects of the present disclosure, the access point 110 and/or user terminal 120 may include a balanced-unbalanced (balun) transformer for converting a single-ended signal to a differential signal, and vice versa, as described in more detail herein.

Figure 2:
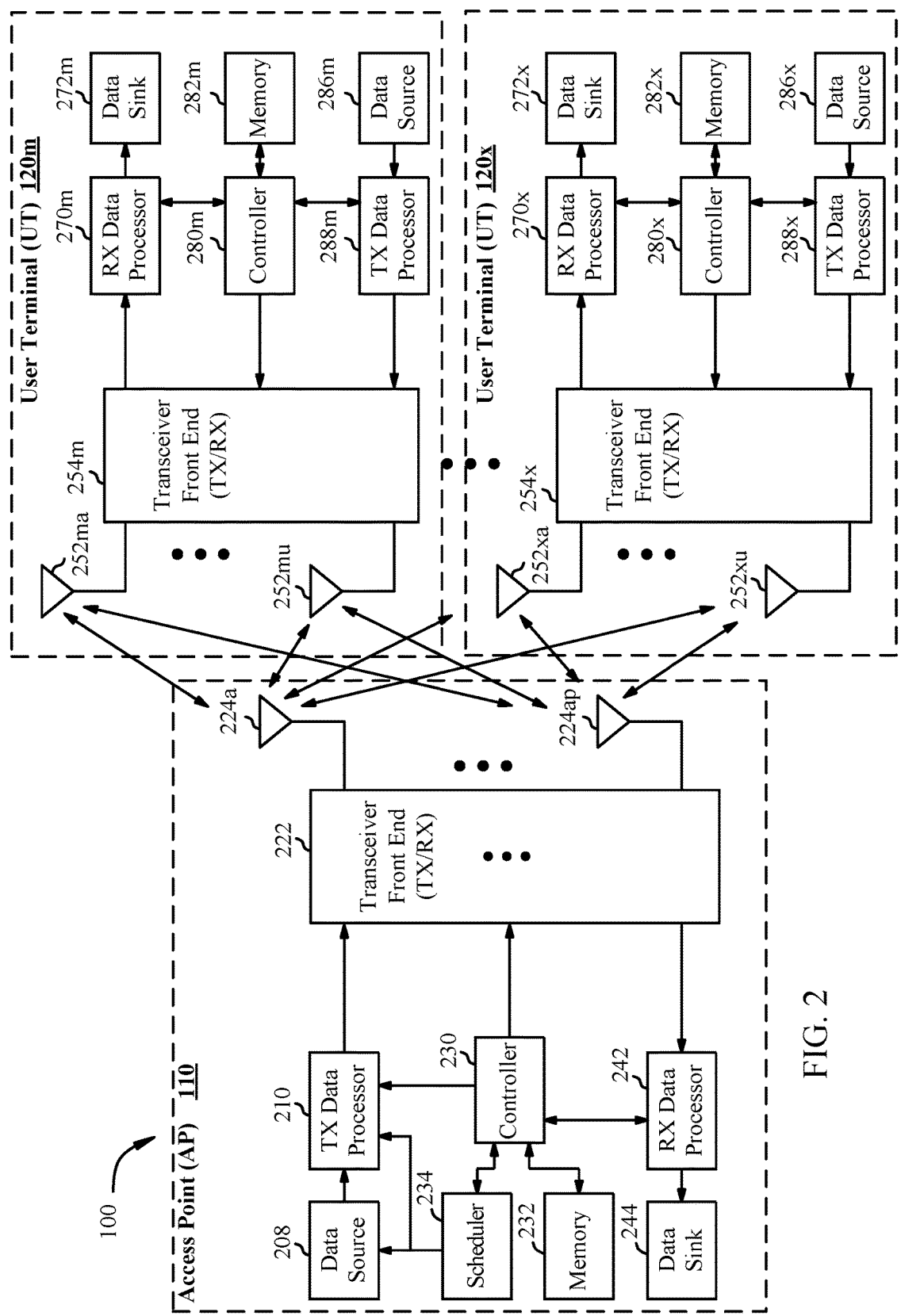
FIG. 2 is a block diagram of an example access point (AP) and example user terminals, in accordance with certain aspects of the present disclosure.

FIG. 2 shows a block diagram of access point 110 and two user terminals 120m and 120x in wireless system 100.

Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via a radio-frequency (RF) switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. The signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing. In certain aspects, the transceiver front end (TX/RX) 222 of access point 110 and/or transceiver front end 254 of user terminal 120 may include a balun transformer for converting a single-ended signal to a differential signal, and vice versa, as described in more detail herein.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front end 254 may select signals received from one of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal.

Figure 3:
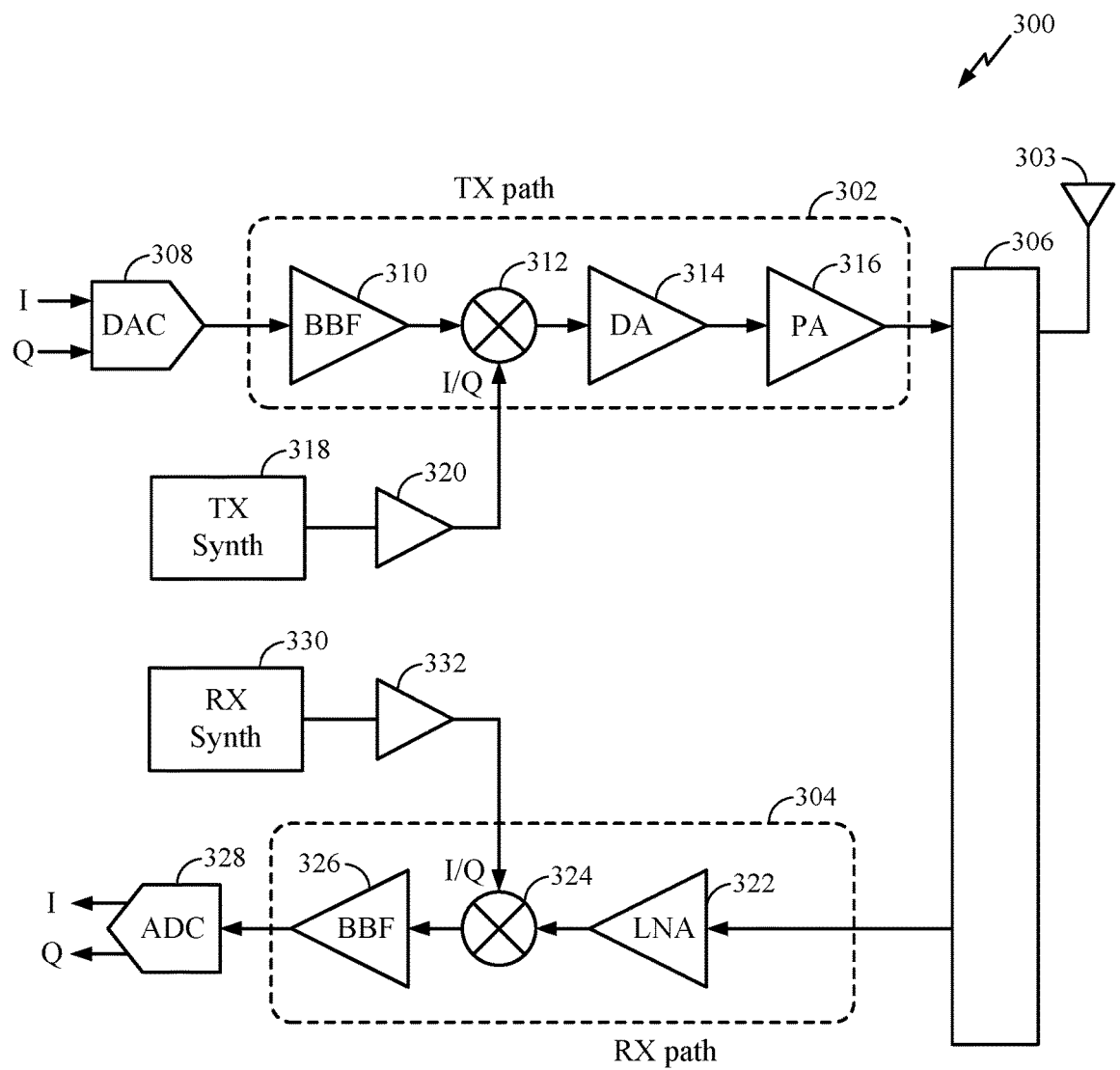
FIG. 3 is a block diagram of an example transceiver front end, in accordance with certain aspects of the present disclosure.

FIG. 3 is a block diagram of an example transceiver front end 300, such as transceiver front ends 222, 254 in FIG. 2, in which aspects of the present disclosure may be practiced. The transceiver front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC), while the PA 316 may be external to the RFIC. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which may be amplified by the DA 314 and/or by the PA 316 before transmission by the antenna 303.

The RX path 304 includes a low noise amplifier (LNA) 322, a mixer 324, and a baseband filter (BBF) 326. In some aspects, the output of the LNA 322 may be coupled to a balun transformer for converting a single-ended signal generated at the output of the LNA to a differential signal to be provided to the mixer 324, as described in more detail herein. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

While it is desirable for the output of an LO to remain stable in frequency, tuning the LO to different frequencies typically entails using a variable-frequency oscillator, which involves compromises between stability and tunability. Contemporary systems may employ frequency synthesizers with a voltage-controlled oscillator (VCO) to generate a stable, tunable LO with a particular tuning range. Thus, the transmit LO frequency may be produced by a TX frequency synthesizer 318, which may be buffered or amplified by amplifier 320 before being mixed with the baseband signals in the mixer 312. Similarly, the receive LO frequency may be produced by an RX frequency synthesizer 330, which may be buffered or amplified by amplifier 332 before being mixed with the RF signals in the mixer 324.

While FIGS. 1-3 provide a wireless communication system as an example application in which certain aspects of the present disclosure may be implemented to facilitate understanding, certain aspects provided herein can be applied in other applications to increase a common-mode rejection ratio (CMRR) of a balun transformer.

Example Transformer with High Common-Mode Rejection Ratio (CMRR)

High common-mode rejection ratio (CMRR) is desired when converting a single-ended signal to a differential signal, and vice versa, via a balun transformer. However, CMRR is degraded due to parasitic capacitance between windings (e.g., also referred to as coils or inductors) of a balun transformer. Certain aspects of the present disclosure are generally directed to a balun transformer topology having improved CMRR as compared to prior balun transformer implementations.

Figure 4:
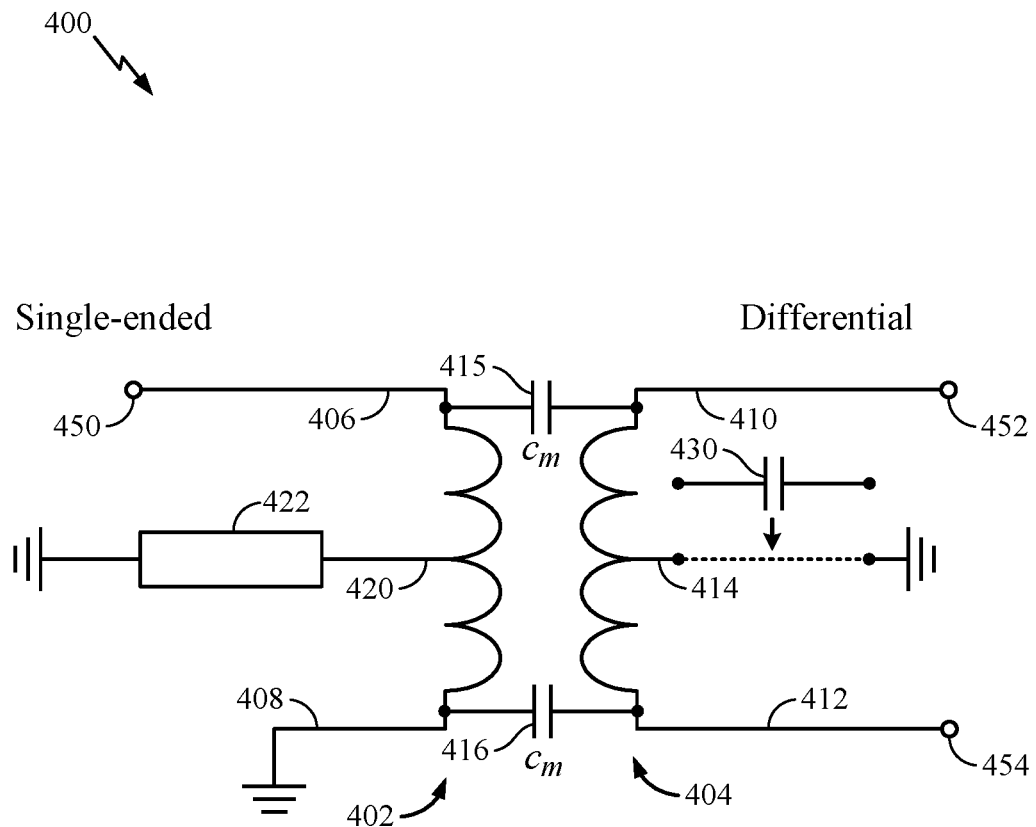
FIG. 4 illustrates an example balanced-unbalanced (balun) transformer, in accordance with certain aspects of the present disclosure.

FIG. 4 illustrates an example balun transformer 400, in accordance with certain aspects of the present disclosure. As illustrated, the balun transformer 400 includes a first winding 402 and a second winding 404. The first winding 402 is magnetically coupled to the second winding 404. The first winding 402 may include a terminal 406 coupled to a single-ended signal node (e.g., an input node 450) and another terminal 408 coupled to a reference potential node (e.g., electrical ground). The second winding 404 may include terminals 410 and 412 coupled to differential pair signal nodes 452 and 454, as illustrated. Moreover, the second winding 404 may have a center tap 414 which may be coupled to the reference potential node, as illustrated. In certain aspects, the center tap 414 of the second winding 404 may be alternating-current (AC) coupled to the reference potential node through, for example, an AC coupling capacitive element. For example, as illustrated, the center tap 414 may be either shorted to the reference potential node, or coupled to the reference potential node through a capacitive element 430.

The first and second windings 402 and 404 may be in close proximity to one another such that the first and second windings 402 and 404 are magnetically coupled. Due to this close proximity, parasitic capacitance, represented by capacitive elements 415 and 416, may be present between the first and second windings 402 and 404, as illustrated. This parasitic capacitance degrades the CMRR of the balun transformer 400 by allowing common-mode current to flow from the first winding 402 to the second winding 404. In certain aspects of the present disclosure, an impedance 422 may be coupled to a center tap 420 of the first winding 402 in order to counteract the common-mode current coupling onto the second winding 404, as described in more detail herein.

Figure 5A:
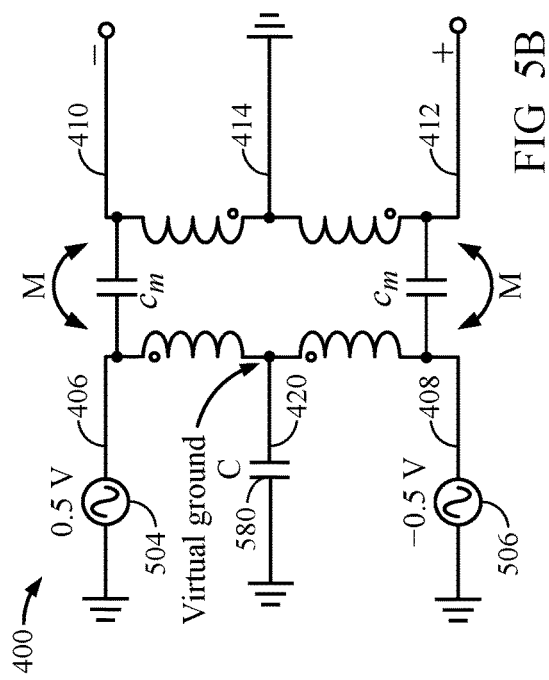
FIGS. 5A-5D illustrate common-mode and differential-mode analyses to facilitate understanding of an example balun transformer, in accordance with certain aspects of the present disclosure.
Figure 5B:
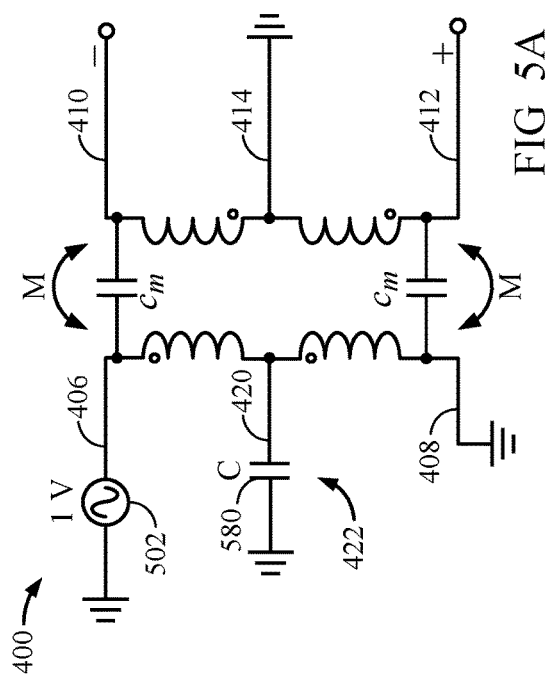
Figure 5C:
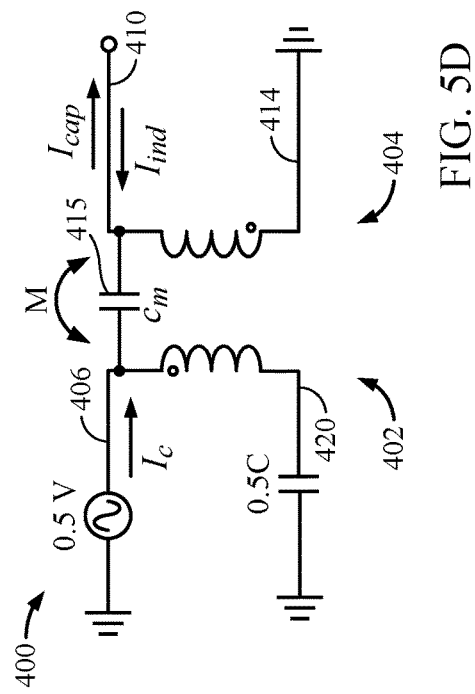

FIGS. 5A-5D illustrate common-mode and differential-mode analyses to facilitate understanding of the example balun transformer 400, in accordance with certain aspects of the present disclosure. For example, a 1 V signal may be applied to the balun transformer 400 via a voltage source 502, as shown in FIG. 5A, the differential-mode component of which may be represented by two voltage sources 504 and 506 providing 0.5 V and −0.5 V, respectively, as illustrated in FIG. 5B, and the common-mode component of which may be represented by voltage sources 508 and 510 providing 0.5 V and 0.5 V, as illustrated in FIG. 5C. The voltages sources 502, 504, 506, 508, and 510 represent AC voltage sources. With respect to the differential-mode component as illustrated in FIG. 5B, the voltage sources 504 and 506 provide the same, yet opposite polarity, voltages, and thus, the center tap 420 acts as a virtual ground. Therefore, the impedance 422, implemented as a capacitive element 580 in this case, has little to no impact on the differential-mode operation of the balun transformer 400.

Figure 5D:
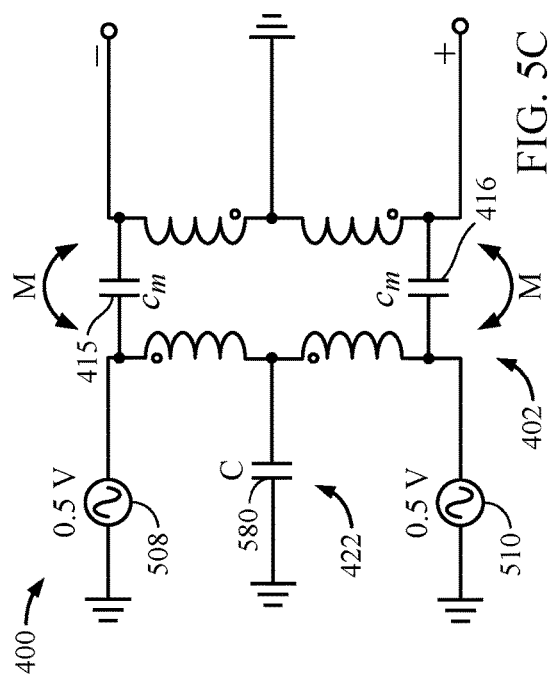

With respect to the common-mode component as illustrated in FIG. 5C, the impedance 422 provides a flow path for common-mode current across the first winding 402, in effect counteracting the leakage current ($I_{cap}$) across the parasitic capacitive elements 415 and 416, as described in more detail with respect to FIG. 5D. FIG. 5D illustrates a portion of the balun transformer 400 between the center taps 420 and 414 and the terminals 406 and 410, respectively. As illustrated, common-mode current ($I_c$) may flow from the terminal 406 to the reference potential node through the impedance 422. The common-mode current ($I_c$) flowing across the first winding 402 generates an inductor current $I_{ind}$ across the second winding 404 due to the magnetic coupling between the first and second windings 402 and 404. Since the first and second windings 402 and 404 have opposite polarities, the inductor current $I_{ind}$ flows from the terminal 410 to the center tap 414. Thus, the inductor current $I_{ind}$ counteracts the current $I_{cap}$ caused by the parasitic capacitance (e.g., capacitive element 415). Therefore, high CMRR may be achieved even with the presence of large parasitic capacitance between windings of a balun transformer.

FIGS. 6A-6D illustrate the example balun transformer 400 having an impedance 422 configured to be selectively coupled to the center tap 420, in accordance with certain aspects of the present disclosure. As illustrated, each of switches 606 and 608 may be used to selectively couple a respective impedance to the center tap 420. By controlling the switches 606 and 608, the impedance between the center tap 420 and the reference potential node may be adjusted. For example, one, both, or none of the switches 606 and 608 may be closed in order to adjust the impedance coupled to the center tap 420, or decouple the impedance from the center tap 420.

Figure 6A:
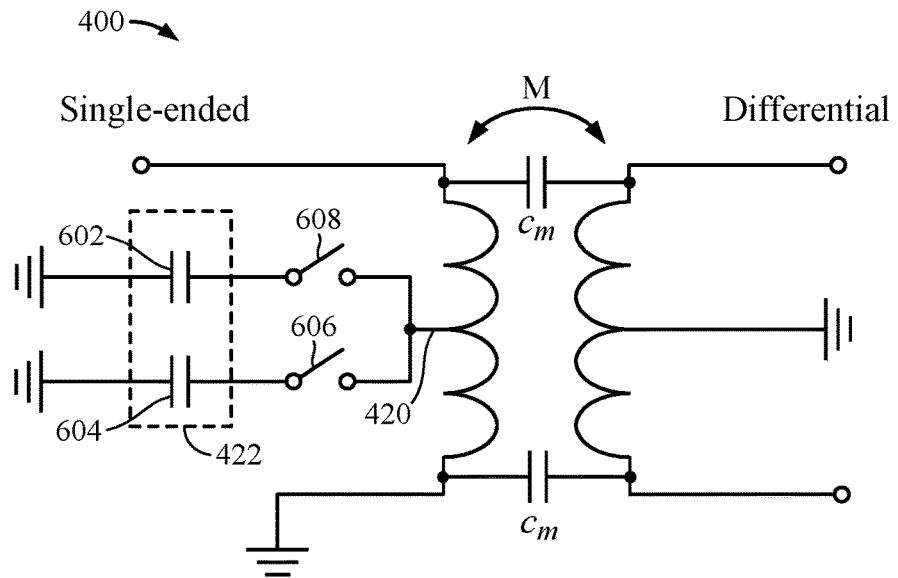
FIGS. 6A-6D illustrate an example balun transformer having an impedance configured to be selectively coupled to a center tap of the transformer, in accordance with certain aspects of the present disclosure.
Figure 6B:
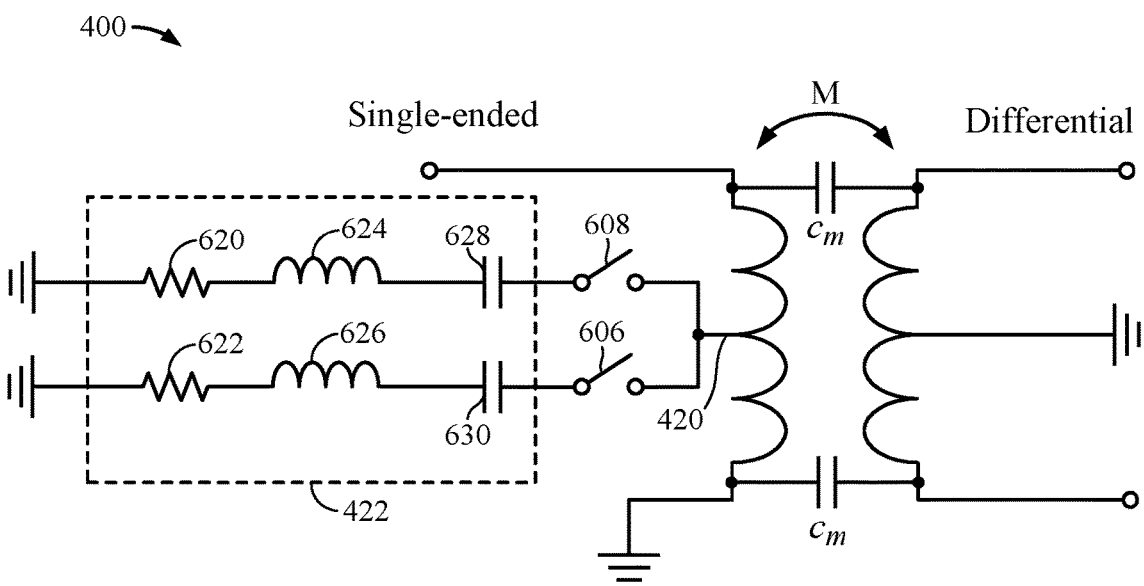

As illustrated in FIG. 6A, the impedance 422 may be a reactive impedance. Each of the switches 606 and 608 may be coupled to a respective capacitive element 602 or 604. As illustrated in FIG. 6B, the impedance 422 may be a complex impedance. Each of the switches 606 and 608 may be coupled to a respective series resistor-inductor-capacitor (RLC) circuit. For example, the switch 608 may selectively couple the series RLC circuit, having a resistive element 620, an inductive element 624, and a capacitive element 628, to the center tap 420, and the switch 606 may selectively couple the series RLC circuit, having a resistive element 622, an inductive element 626, and a capacitive element 630, to the center tap 420.

Figure 6C:
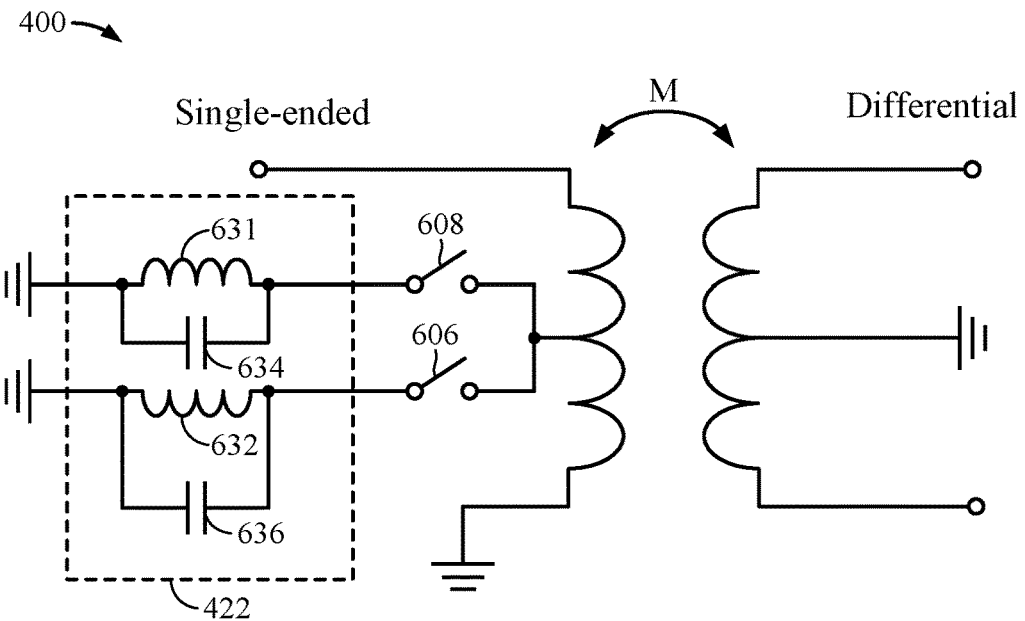
Figure 6D:
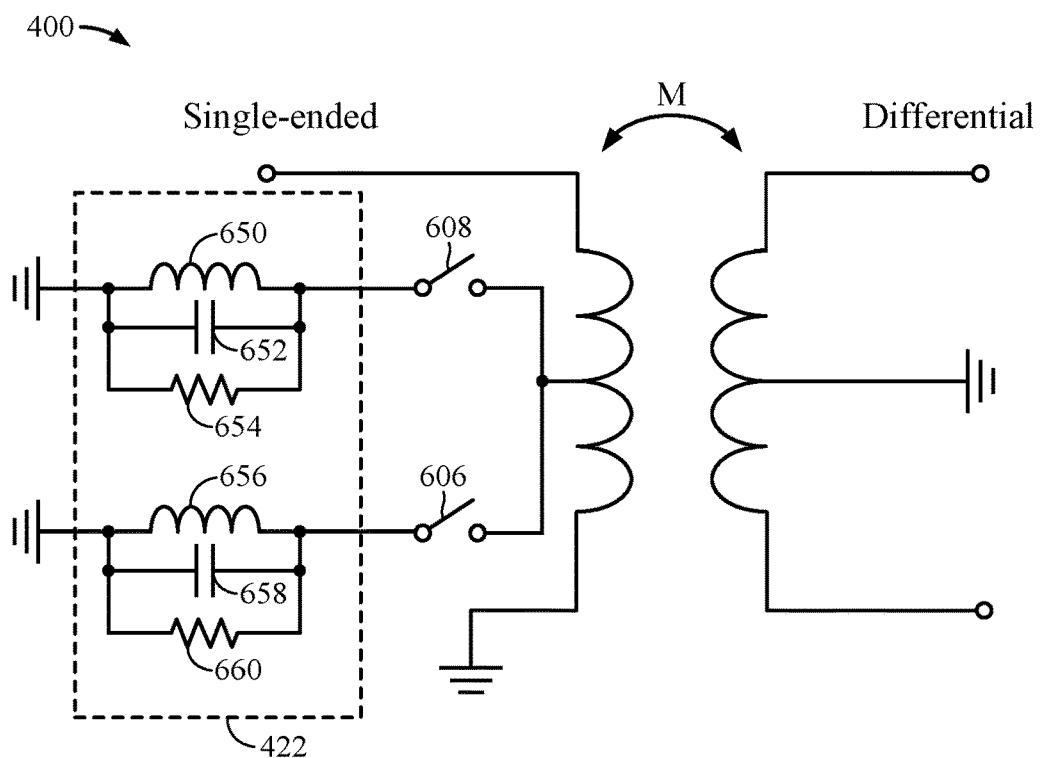

As illustrated in FIG. 6C, each of the switches 606 and 608 may be coupled to a parallel inductor-capacitor (LC) circuit. For example, the switch 608 may selectively couple a parallel LC circuit, having an inductive element 631 and a capacitive element 634, to the center tap 420, and the switch 606 may selectively couple a parallel LC circuit, having an inductive element 632 and a capacitive element 636, to the center tap 420.

As illustrated in FIG. 6C, each of the switches 606 and 608 may be coupled to a parallel resistor-inductor-capacitor (RLC) circuit. For example, the switch 608 may selectively couple a parallel RLC circuit, having the inductive element 650, the capacitive element 652 and the resistive element 654, to the center tap 420, and the switch 606 may selectively couple a parallel RLC circuit, having an inductive element 656, a capacitive element 658, and a resistive element 660, to the center tap 420.

In certain aspects, each winding of the balun transformer 400 may have a one turn or multi-turn structure. In some cases, windings of the balun transformer 400 may be implemented on single metal layers or multiple metal layers. In certain aspects, the balun transformer 400 may be on-chip, on a printed circuit board (PCB), or implemented as a discrete component using multiple coils.

The impedance 422 may be implemented as a reactive impedance, a resistive impedance, or a complex impedance (including both a resistance and a reactance). In certain aspects, the impedance 422 may be implemented with a capacitive element, an inductive element, or a resistive element, or any combination of the capacitive element, the inductive element, or the resistive element, which may be coupled in parallel and/or in series. For example, the impedance 422 may be a capacitive element in series with a resistive element, an inductive element and a capacitive element in series or parallel, or a capacitive element in parallel with a resistive element, to name just a few configurations.

In certain aspects, the impedance 422 may be directly coupled, or selectively coupled via one or more switches, to a center tap of a winding, as described herein. In certain aspects, the capacitive elements described herein may be implemented as metal-oxide-metal (MOM), metal-oxide-semiconductor (MOS), or metal-insulator-metal (MIM) capacitors, or a combination thereof. Moreover, the resistive elements as described herein may be implemented as poly resistors or metal resistors.

FIG. 7 is a flow diagram of example operations 700 for signal conversion, in accordance with certain aspects of the present disclosure. The operations 700 may be performed by a balun transformer, such as the balun transformer 400.

The operations 700 may begin, at block 702, by sinking a common-mode current (e.g., common-mode current $I_c$ described with respect to FIG. 5D) from a center tap (e.g., center tap 420) of a first winding (e.g., first winding 402) of a transformer (e.g., balun transformer 400) to a reference potential node, the first winding having a first terminal (e.g., terminal 406) coupled to an input node, a second terminal (e.g., terminal 408) coupled to the reference potential node. At block 704, a current (e.g., inductor current $I_{ind}$ described with respect to FIG. 5D) is generated across a second winding (e.g., second winding 404) of the transformer corresponding to the common-mode current, the second winding being magnetically coupled to the first winding and having a first terminal (e.g., terminal 410) coupled to a first differential node of a differential output pair, a second terminal (e.g., terminal 412) coupled to a second differential node of the differential output pair, and a center tap (e.g., center tap 414) coupled to the reference potential node.

In certain aspects, the common-mode current is sunk through a first impedance (e.g., impedance 422). In some cases, the first impedance may include a reactive impedance. For example, the reactive impedance may include a capacitive element (e.g., capacitive element 634). In certain aspects, the reactive impedance may also include an inductive element (e.g., the inductive element 631). In other aspects, the first impedance may include a complex impedance. For example, the complex impedance may include a resistive element (e.g., resistive element 620) coupled in series with a capacitive element (e.g., capacitive element 628). In certain aspects, the complex impedance may include a resistive element (e.g., resistive element 654) coupled in parallel with a capacitive element (e.g., capacitive element 652). In certain aspects, the complex impedance may include an inductive element (e.g., inductive element 650) and a resistive element (e.g., resistive element 654). In certain aspects, the complex impedance may also include a capacitive element (e.g., capacitive element 652) coupled in parallel with the resistive element and coupled in parallel with the inductive element.

In certain aspects, the sinking of the common-mode current may include selectively coupling the first impedance between the center tap of the first winding and the reference potential node. In certain aspects, the sinking of the common-mode current may also include selectively coupling a second impedance (e.g., capacitive element 604) between the center tap of the first winding and the reference potential node.

Figure 8:
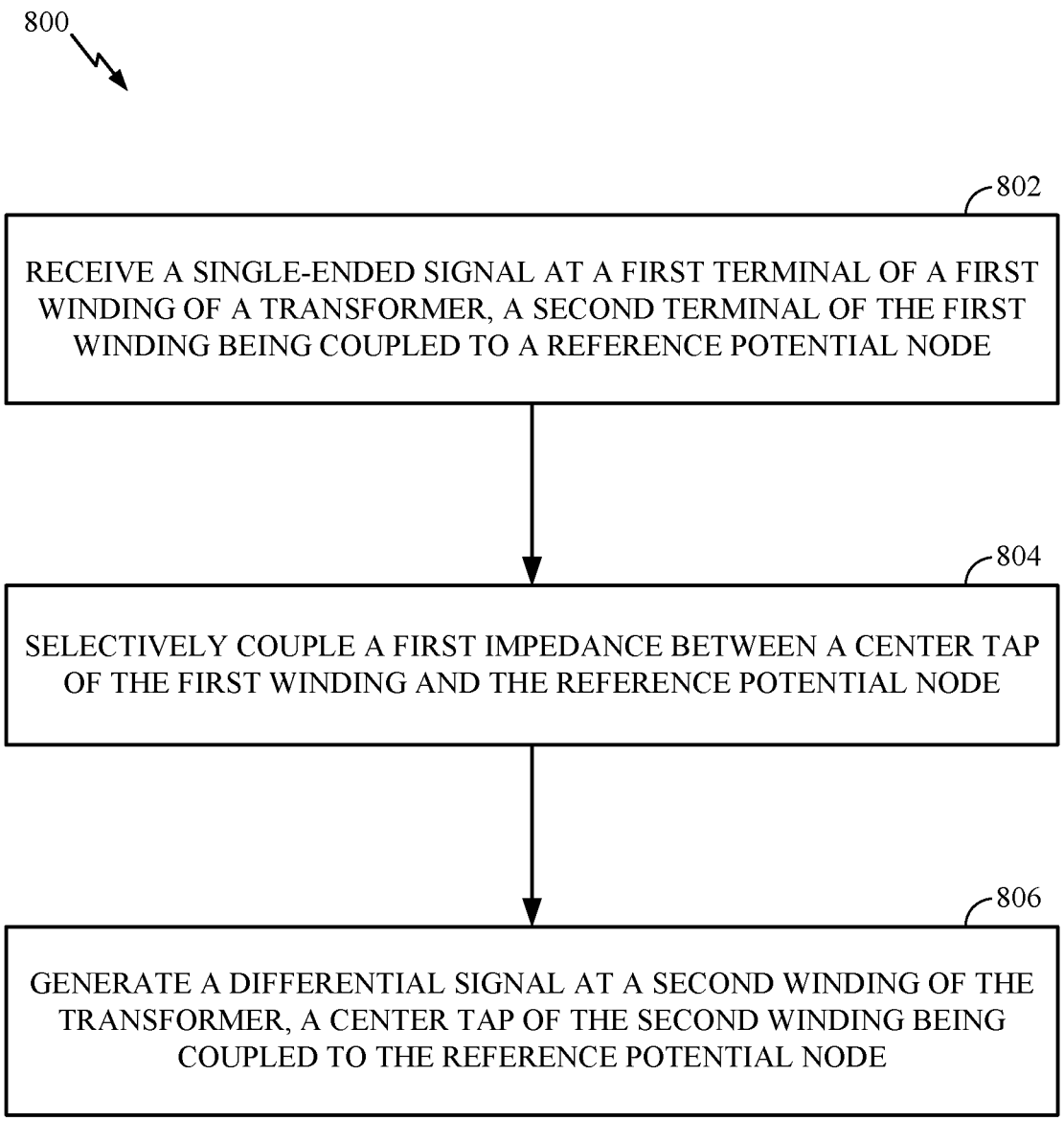
FIG. 8 is a flow diagram of example operations for signal conversion by selectively coupling an impedance to a center tap of a transformer, in accordance with certain aspects of the present disclosure.

FIG. 8 is a flow diagram of example operations 800 for signal conversion, in accordance with certain aspects of the present disclosure. The operations 800 may be performed by a balun transformer, such as the balun transformer 400.

The operations 800 may begin, at block 802, by receiving a single-ended signal at a first terminal (e.g., terminal 406) of a first winding (e.g., first winding 402) of a transformer (e.g., balun transformer 400), a second terminal (e.g., terminal 408) of the first winding being coupled to a reference potential node. At block 804, a first impedance (e.g., impedance 422) may be selectively coupled between a center tap (e.g., center tap 420) of the first winding and the reference potential node. The operations 800 continue, at block 806, by generating a differential signal at a second winding (e.g., second winding 404) of the transformer, a center tap (e.g., center tap 414) of the second winding being coupled to the reference potential node.

The various operations of methods described above may be performed by any suitable means capable of performing the corresponding functions. The means may include various hardware component(s) and/or module(s), including, but not limited to one or more circuits. Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules, and circuits described in connection with the present disclosure may be implemented or performed with discrete hardware components designed to perform the functions described herein.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A transformer comprising:
   a first winding having a first terminal coupled to an input node, and a second terminal coupled to a reference potential node;
   a first impedance coupled between a tap of the first winding and the reference potential node, wherein the first impedance comprises a complex impedance; and
   a second winding magnetically coupled to the first winding and having a first terminal coupled to a first differential node of a differential output pair, a second terminal coupled to a second differential node of the differential output pair, and a tap coupled to the reference potential node.

2. The transformer of claim 1, wherein the complex impedance comprises a capacitive element.

3. The transformer of claim 2, wherein the complex impedance further comprises an inductive element.

4. The transformer of claim 1, wherein the complex impedance comprises a resistive element coupled in series with a capacitive element.

5. The transformer of claim 1, wherein the complex impedance comprises a resistive element coupled in parallel with a capacitive element.

6. The transformer of claim 1, wherein the complex impedance comprises an inductive element and a resistive element.

7. The transformer of claim 6, wherein the complex impedance further comprises a capacitive element coupled in parallel with the resistive element and coupled in parallel with the inductive element.

8. The transformer of claim 1, further comprising:
a first switch configured to selectively couple the first impedance between the tap of the first winding and the reference potential node.

9. The transformer of claim 1, further comprising:
a second impedance; and
a second switch configured to selectively couple the second impedance between the tap of the first winding and the reference potential node.

10. The transformer of claim 1, wherein the tap of the second winding is coupled to the reference potential node through an alternating-current (AC) coupling capacitive element.

11. The transformer of claim 1, wherein the first winding and the second winding are configured with opposite polarities.

12. The transformer of claim 1, wherein the tap of the first winding comprises a center tap of the first winding, and wherein the tap of the second winding comprises a center tap of the second winding.

13. A method for signal conversion, comprising:
sinking a common-mode current from a tap of a first winding of a transformer to a reference potential node, wherein the common-mode current is sunk through a first impedance comprising a complex impedance, the first winding having a first terminal coupled to an input node, and a second terminal coupled to the reference potential node; and
generating a current across a second winding of the transformer corresponding to the common-mode current, the second winding being magnetically coupled to the first winding and having a first terminal coupled to a first differential node of a differential output pair, a second terminal coupled to a second differential node of the differential output pair, and a tap coupled to the reference potential node.

14. The method of claim 13, wherein sinking the common-mode current comprises:
selectively coupling the first impedance between the tap of the first winding and the reference potential node.

15. The method of claim 14, wherein sinking the common-mode current further comprises:
selectively coupling a second impedance between the tap of the first winding and the reference potential node.

16. The method of claim 13, wherein the tap of the first winding comprises a center tap of the first winding, and wherein the tap of the second winding comprises a center tap of the second winding.

17. The method of claim 13, wherein the complex impedance comprises a resistive element coupled in parallel with a capacitive element.

18. A method for signal conversion, comprising:
receiving a single-ended signal at a first terminal of a first winding of a transformer, a second terminal of the first winding being coupled to a reference potential node;
selectively coupling a complex impedance between a tap of the first winding and the reference potential node; and
generating a differential signal at a second winding of the transformer, a tap of the second winding being coupled to the reference potential node.

19. The method of claim 18, wherein the tap of the first winding comprises a center tap of the first winding, and wherein the tap of the second winding comprises a center tap of the second winding.

20. The method of claim 18, wherein the complex impedance comprises a resistive element coupled in series with a capacitive element.

* * * * *